United States Patent
Jung

(10) Patent No.: US 10,560,091 B2
(45) Date of Patent: Feb. 11, 2020

(54) SWITCH ASSEMBLY OF REACTIVE POWER COMPENSATION APPARATUS

(71) Applicant: LSIS CO., LTD., Anyang-si, Gyeonggi-do (KR)

(72) Inventor: Teagsun Jung, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 16/279,480

(22) Filed: Feb. 19, 2019

(65) Prior Publication Data

US 2019/0305771 A1 Oct. 3, 2019

(30) Foreign Application Priority Data

Mar. 30, 2018 (KR) .................. 10-2018-0037098

(51) Int. Cl.
*G05F 1/70* (2006.01)
*H03K 17/687* (2006.01)
(Continued)

(52) U.S. Cl.
CPC ............ *H03K 17/687* (2013.01); *G05F 1/70* (2013.01); *H01L 23/40* (2013.01); *H02J 3/1864* (2013.01);
(Continued)

(58) Field of Classification Search
CPC ........... H02M 7/003; H02L 2023/4025; H02L 25/117
See application file for complete search history.

(56) References Cited

U.S. PATENT DOCUMENTS 3,864,607 A * 2/1975 Phillips .............. H05K 7/20509
361/692
5,940,273 A * 8/1999 Fishman ............. H01L 23/4006
165/185
(Continued)

FOREIGN PATENT DOCUMENTS

JP 2002044965 A 2/2002
JP 2016034003 A 3/2016
(Continued)

OTHER PUBLICATIONS

Korean Office Action for related Korean Application No. 0037098 action dated Jun. 12, 2019; (5 pages).
(Continued)

*Primary Examiner* — Harry R Behm
(74) *Attorney, Agent, or Firm* — K&L Gates LLP

(57) ABSTRACT

A switch assembly of a reactive power compensation apparatus may include a first switching module having a first stack structure perpendicular to a supporting module, and a second switching module having a second stack structure perpendicular to the supporting module, the second switching module being connected in parallel with the first switching module. Each of the first and second switching modules may include a plurality of cooling plates stacked along a vertical direction with respect to the supporting module, and a plurality of switches disposed between the plurality of cooling plates. The cooling plate may include an engagement portion disposed on one side of the upper surface to be located at a normal position by guiding the switch.

9 Claims, 10 Drawing Sheets

(51) Int. Cl.
*H03K 17/14* (2006.01)
*H02J 3/18* (2006.01)
*H05K 7/20* (2006.01)
*H02M 7/00* (2006.01)
*H01L 23/40* (2006.01)
*H01L 25/11* (2006.01)

(52) U.S. Cl.
CPC ............ *H02M 7/003* (2013.01); *H03K 17/14* (2013.01); *H05K 7/20927* (2013.01); *H01L 25/117* (2013.01)

(56) References Cited

U.S. PATENT DOCUMENTS

| | | | | |
|---|---|---|---|---|
| 5,986,906 A | * | 11/1999 | Ramezani | H01L 25/18 363/136 |
| 6,333,853 B2 | * | 12/2001 | O'Leary | H05K 7/209 165/185 |
| 6,492,720 B1 | * | 12/2002 | Yamaguchi | H01L 23/4012 257/686 |
| 2002/0017717 A1 | * | 2/2002 | Gruning | H02M 7/003 257/718 |

FOREIGN PATENT DOCUMENTS

| | | |
|---|---|---|
| JP | 2016208711 A | 12/2016 |
| JP | 2017022863 A | 1/2017 |
| KR | 20140115185 A | 9/2014 |
| WO | 2016170910 A1 | 10/2016 |

OTHER PUBLICATIONS

European Search Report for related European Application No. 19158140.4; action dated May 14, 2019; (7 pages).

* cited by examiner

SWITCH ASSEMBLY OF REACTIVE POWER COMPENSATION APPARATUS

CROSS-REFERENCE TO RELATED APPLICATIONS

Pursuant to 35 U.S.C. § 119(a), this application claims the benefit of earlier filing date and right of priority to Korean Application No. 10-2018-0037098, filed on Mar. 30, 2018, which is herein expressly incorporated by reference in its entirety.

BACKGROUND OF THE INVENTION

1. Field of the Invention

The present disclosure relates to a switch assembly of a reactive power compensation apparatus.

2. Description of the Conventional Art

Due to the development of industry and the increase of the population, power demand is soaring, but power production is limited.

Accordingly, a power system for supplying power generated at a production site to a demand site stably without loss has become increasingly important.

There is a need for FACTS (Flexible AC Transmission System) facilities for power flow, system voltage, and stability improvement. The FACTS facilities include reactive power compensation apparatuses such as a SVC (Static Var Compensator) or a STATCOM (STATic synchronous COMpensator). These reactive power compensation apparatuses are connected in parallel to a power system to compensate for reactive power required in the power system.

The SVC may be configured by combining a Thyristor Controlled Reactor (TCR) that controls the phase of a reactor using a thyristor according to its application, a Thyristor Switched Capacitor (TSC) that switches a capacitor, a Fixed Capacitor Bank, and the like.

The SVC may include a thyristor valve connected to a transformer to control the voltage of the power system and a gate unit that controls the gate of the thyristor valve.

When a plurality of thyristors are connected in series to each other in the thyristor valve and conducted under the control of the gate unit, a high voltage or a high current flows through the thyristor. In addition, each thyristor is heavy and bulky, so it is not easy to handle.

Therefore, in order to construct a thyristor valve in an SVC as an assembly, many considerations such as the arrangement of the thyristor, the insulation of the thyristor, the heat dissipation of the thyristor, the weight of the thyristor, and the volume of the thyristor must be taken into account.

However, an optimal SVC-related switch assembly has not yet been developed to satisfy all of these requirements.

Moreover, in a thyristor valve in the related art, it has been difficult to align the thyristor at a normal position since the thyristor is heavy.

SUMMARY OF THE INVENTION

The present disclosure is provided to solve the foregoing and other problems.

Another object of the present disclosure is to provide a switch assembly of a reactive power compensation apparatus of a new structure.

Still another object of the present disclosure is to provide a switch assembly of a reactive power compensation apparatus having an optimal arrangement structure satisfying various requirements.

Yet still another object of the present disclosure is to provide a switch assembly of a reactive power compensation apparatus that is easy to align at a normal position.

In order to achieve the foregoing and other objects, according to an aspect of the present disclosure, there is provided a switch assembly of a reactive power compensation apparatus, and the switch assembly may include a support module; a first switching module having a first stack structure perpendicular to the supporting module; and a second switching module having a second stack structure perpendicular to the supporting module, the second switching module being connected in parallel with the first switching module. Each of the first and second switching modules may include a plurality of cooling plates stacked along a vertical direction with respect to the supporting module; and a plurality of switches disposed between the plurality of cooling plates. The cooling plate may include an engagement portion disposed on one side of the upper surface to be located at a normal position by guiding the switch.

Here, the switch may include a body embedded with a semiconductor device; a first support plate disposed on one side surface of the body; and a second support plate disposed on the other side surface of the body.

Furthermore, the first and second support plates may have different sizes.

Furthermore, the upper surface of the cooling plate in the first switching module or the second switching module may be in contact with the first support plate or the second support plate.

Furthermore, a thickness of the engagement portion may be formed larger than that of the first support plate or the second support plate.

Furthermore, the engagement portion may include at least one or more engagement protrusions having a circular shape.

Furthermore, the at least one or more engagement protrusions may be spaced apart by a radius of the switch from the center of the cooling plate.

Furthermore, the engagement portion may be formed in a round shape on an inner side surface thereof and brought into surface contact with the first support plate or the second support plate.

Furthermore, the cooling plate may further include a protruding portion protruded from the side surface to stack the plurality of cooling plates at normal positions.

Furthermore, the protruding portion may include a guide hole for being inserted into a guide rod provided to maintain the normal position.

In addition, the protruding portions may be disposed on both sides of the cooling plate.

The effects of the switch assembly of the reactive power compensation apparatus according to each embodiment of the present disclosure will be described as follows.

The effects of the switch assembly of the reactive power compensation apparatus according to an embodiment will be described as follows.

According to at least one of embodiments, a thyristor and a switch may be stacked in a vertical direction, thereby having an advantage capable of optimizing arrangement structure and minimizing the occupied area.

According to at least one of embodiments, a cooling plate through which cooling water flows on the upper and lower surfaces of the switch may be provided, thereby having an advantage of facilitating heat dissipation of the switch.

According to at least one of embodiments, the switch, the cooling plate, and the like may be modularized, thereby having an advantage of facilitating installation.

According to at least one of embodiments, a switch during a sliding movement is stopped by an engagement portion provided on the cooling plate, and thus there is an advantage capable of easily aligning each switch stacked in a vertical direction at a normal position.

Further scope of applicability of the embodiments will become apparent from the detailed description given hereinafter. However, it should be understood that the detailed description and specific embodiments such as preferred embodiments are given by way of illustration only, since various changes and modifications within the spirit and scope of the embodiments will become apparent to those skilled in the art from this detailed description.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
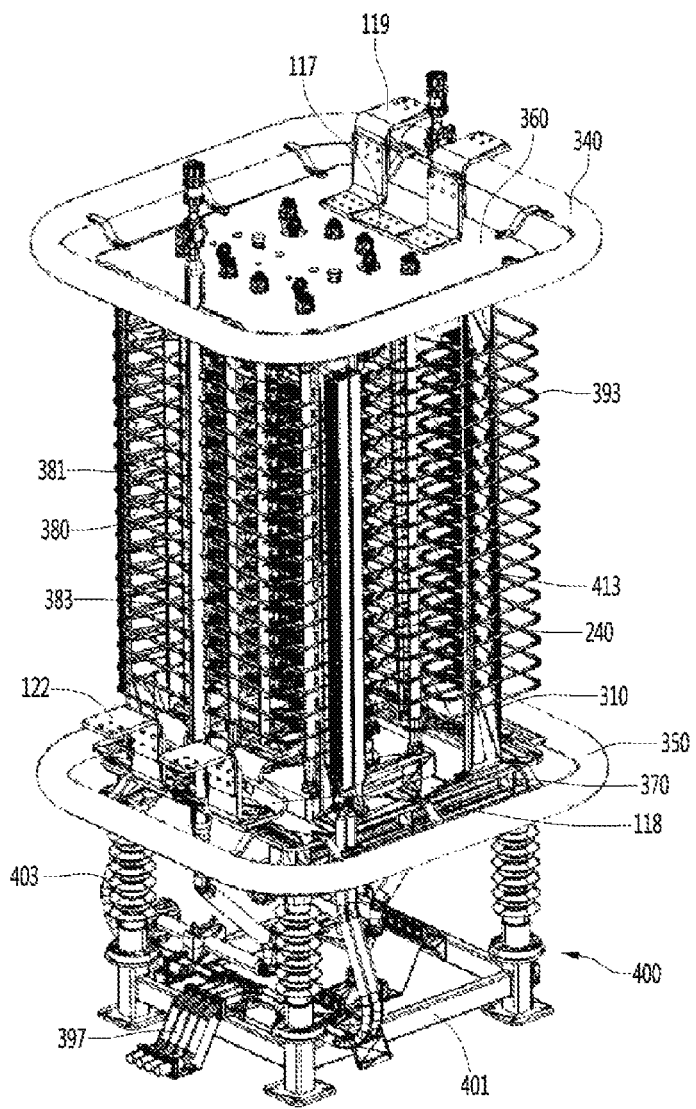
FIG. 1 is a perspective view illustrating a switch assembly of a reactive power compensation apparatus according to an embodiment.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the embodiments disclosed herein, moreover, the detailed description will be omitted when specific description for publicly known technologies to which the invention pertains is judged to obscure the gist of the present disclosure. Furthermore, it should be understood that the accompanying drawings are merely illustrated to easily understand an embodiment disclosed herein, and therefore, the technological concept disclosed herein is not limited by the accompanying drawings, and the concept of the present disclosure should be understand to include all modifications, equivalents, and substitutes included in the concept and technological scope of the embodiment.

Figure 2:
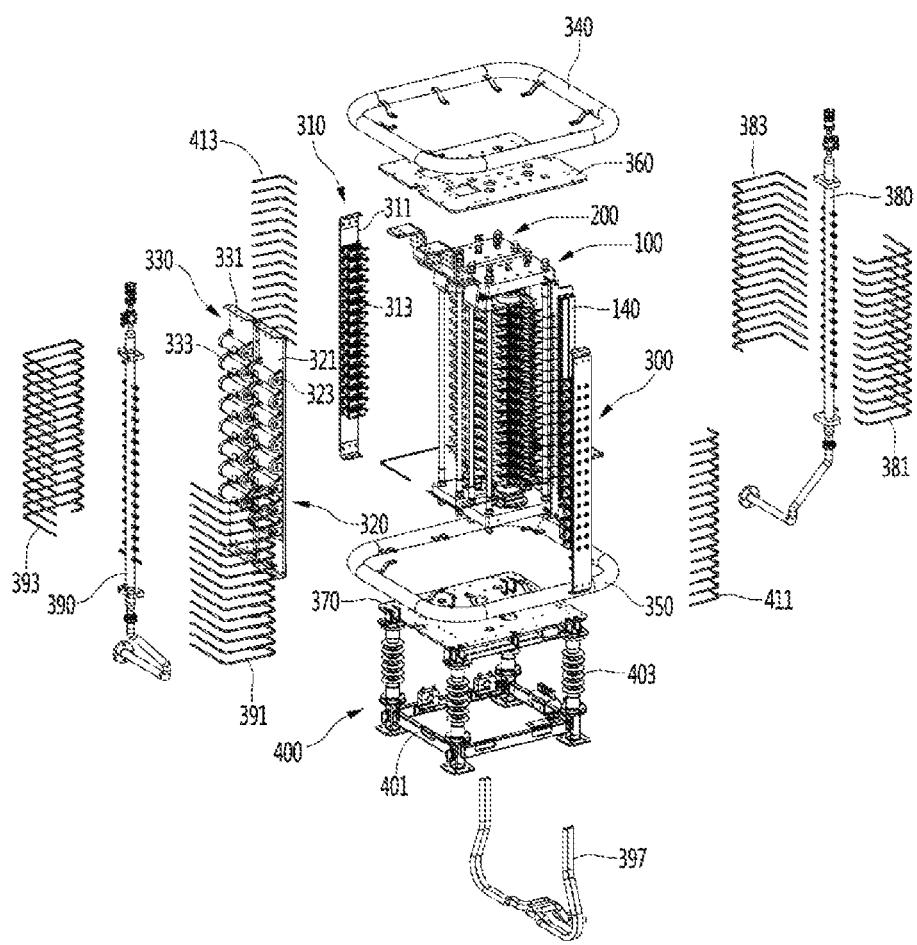
FIG. 2 is a perspective view illustrating a switch assembly of a reactive power compensation apparatus according to an embodiment.
Figure 3:
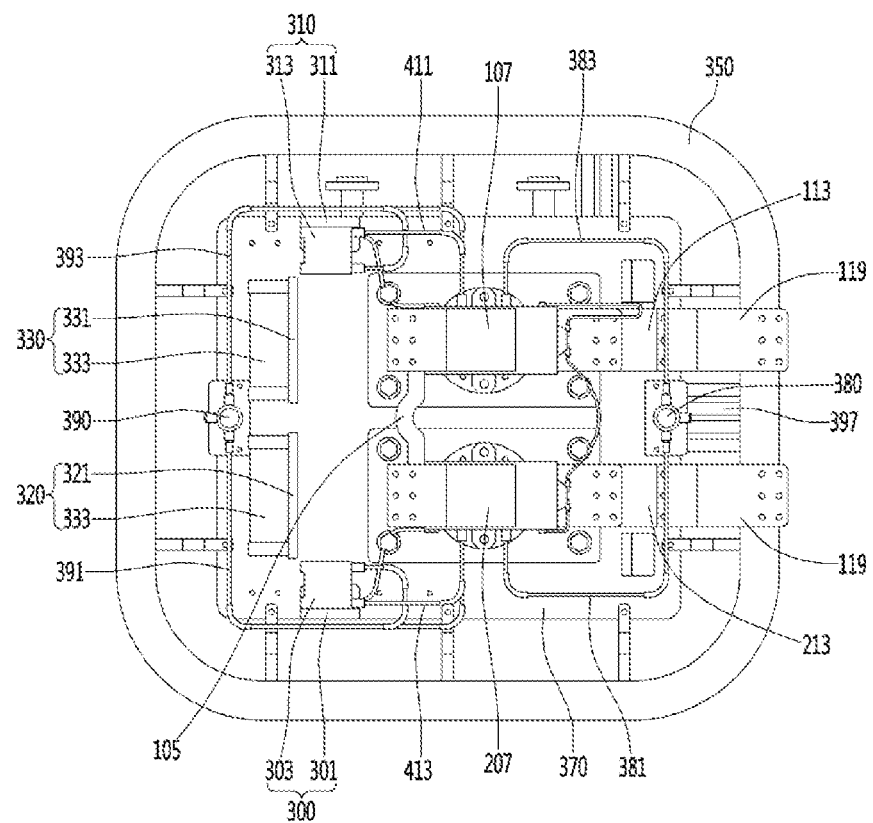
FIG. 3 is a perspective view illustrating a switch assembly of a reactive power compensation apparatus according to an embodiment.

FIG. 1 is a perspective view illustrating a switch assembly of a reactive power compensation apparatus according to an embodiment, and FIG. 2 is an exploded perspective view illustrating a switch assembly of a reactive power compensation apparatus according to an embodiment, and FIG. 3 is a plan view illustrating a switch assembly of a reactive power compensation apparatus according to an embodiment. The reactive power compensating apparatus illustrated in FIGS. 1 through 3 illustrate a stationary reactive power compensating apparatus, for instance, but the embodiment is not limited thereto.

FIGS. 1 through 3 illustrate a single switch assembly, but a plurality of switch assemblies electrically connected to each other are also possible.

<Support Module>

A switch assembly of a reactive power compensation apparatus according to an embodiment may provide a support module 400.

The support module 400 may support all components constituting the reactive power compensation apparatus. The support module 400 may allow the components disposed thereon to be insulated from the earth.

The support module 400 may include a frame 401 including four columns and four connecting portions that connect these columns. The frame 401 may be made of a material having excellent insulation and excellent supporting strength. For instance, the frame 401 may be made of stainless steel or a steel beam.

For instance, the column may be provided with an insulating member 403 or the column itself may be the insulating member 403. The insulating member 403 may be an insulator. The insulator is an insulating body used for insulating and supporting an electric conductor, and hard porcelain may be used for the insulating body, for instance.

Though will be described later, the support module 400 may be provided with a fastening portion for fastening an optical cable 397 or a fastening portion for fastening first and second main pipes 380, 390. The optical cable 397 supplies a drive signal, for example, a gate signal, to a first switching module 100 or a second switching module 200, or supplies various signals measured from the first switching module 100 or the second switching module 200, for instance, a voltage signal, a current signal, a temperature signal, and the like, to a controller (not shown). The first and second main pipes 380, 390 supply cooling water to the first switching module 100 or the second switching module 200 to cool the first switching module 100 or the second switching module 200.

<First Switching Module 100>

Figure 4:
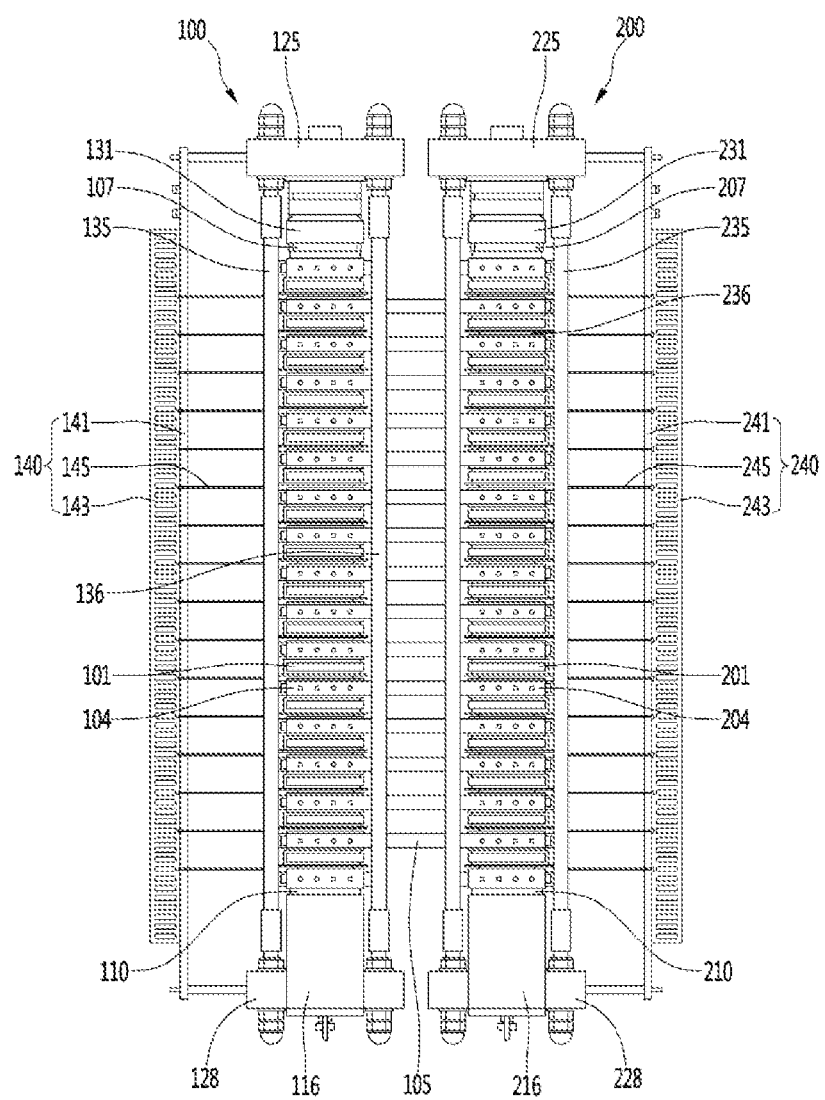
FIG. 4 is a front view illustrating a switching module according to an embodiment.

A switch assembly of a reactive power compensation apparatus according to an embodiment may include the first switching module 100. The first switching module 100 may have a first stack structure that is perpendicular to the support module 400. The first switching module 100 will be described in detail with reference to FIGS. 4 and 5. FIG. 4 is a front view illustrating a switching module according to an embodiment, and FIG. 5 is a perspective view illustrating a switching module according to an embodiment.

Figure 5:
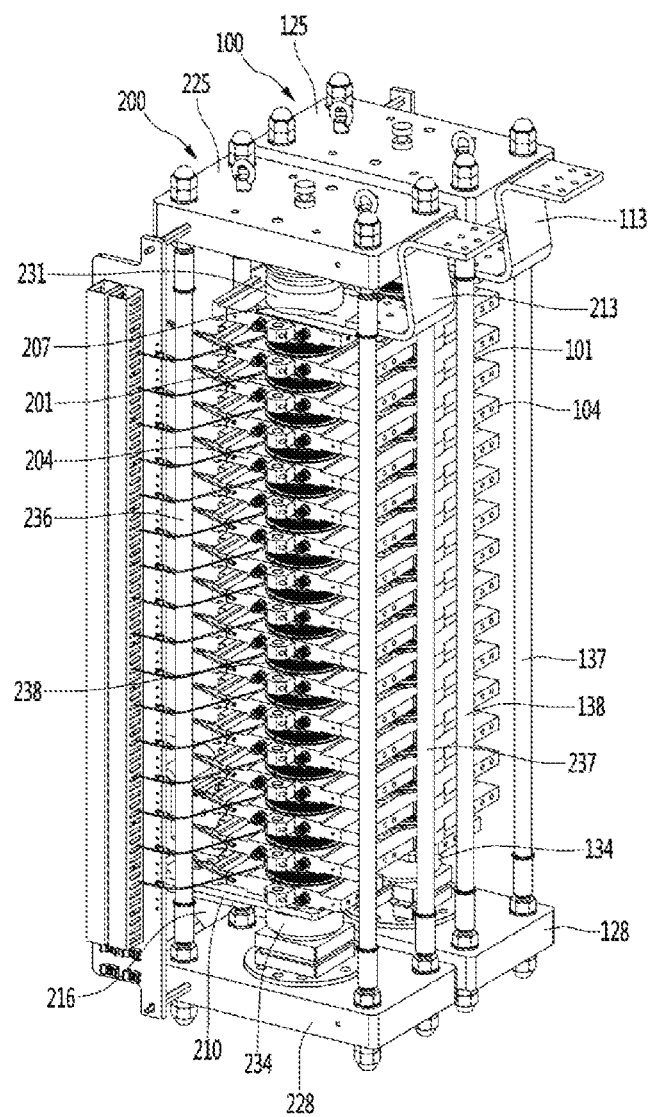
FIG. 5 is a perspective view illustrating a switching module according to an embodiment.

Referring to FIGS. 4 and 5, the first switching module 100 may be disposed on the support module 400. A second support plate 370 which will be described later is fastened to an upper surface of the support module 400, and both the first switching module 100 and the second switching module 200 may be fastened to the second support plate 370. A second support plate 370 may be disposed under the first switching module 100 and the second switching module 200. Moreover, a second support plate 360 may be disposed under the first switching module 100 and the second switching module 200. In this case, an upper side of each of the first and second switching modules 100, 200 may be fastened to the first support plate 360. Accordingly, the first and second switching modules 100, 200 may be disposed between the first support plate 360 and the second support plate 370.

The first switching module 100 may include a plurality of switches 101 stacked along a vertical direction with respect to the support module 400. The first switching module 100 may be a forward switching module in which a current flows from the second electrode plate 110 to the first electrode plate 107 in an upward direction, for instance, but the present disclosure is not limited thereto.

The plurality of switches 101 may be connected in series to each other. A first switch is provided, a second switch is disposed on the first switch, and a second switch is disposed on the second switch. In this manner, the plurality of switches 101 may be arranged on the support module 400.

The switch 101 may be formed in a circular shape when viewed from above, but the present disclosure is not limited thereto. The switch 101 includes a body, and a semiconductor device may be embedded in the body. The body may be made of insulating material. Each of the lower surface and the upper surface of the body may have a planar shape.

The switch 101 may be a semiconductor device, for instance, a thyristor. The switch 101 may include a gate, an anode, and a cathode. For instance, it is assumed that a first switch, a second switch, and a third switch are sequentially arranged on the support module 400. In this case, the cathode of the second switch may be electrically connected to the anode of the first switch, and the anode of the second switch may be electrically connected to the cathode of the third switch.

Figure 6:
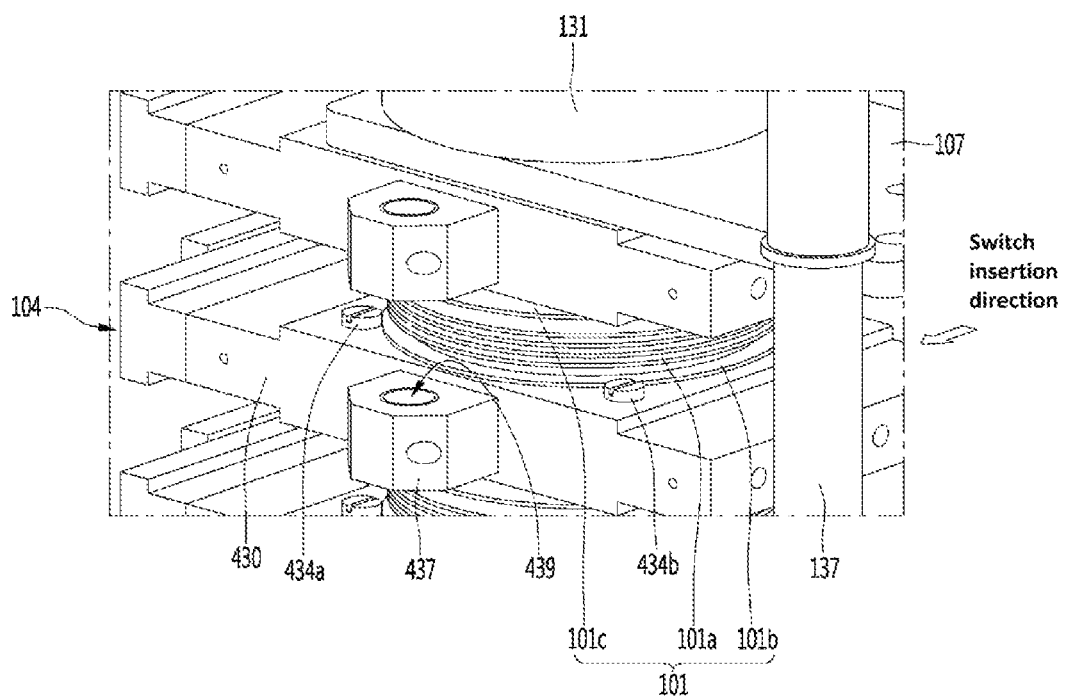
FIG. 6 is an enlarged view illustrating a first switching module according to an embodiment.

The switch 101 may include a body 101a, a first support plate 101b disposed on one side of the body 101a, and a second support plate 101c disposed on the other side of the body 101a, as illustrated in FIG. 6.

A semiconductor device may be embedded in the body 101a. For instance, an anode of the semiconductor device may be disposed adjacent to the first support plate 101b, and a cathode of the semiconductor device may be disposed adjacent to the second support plate 101c. When the semiconductor device is conducted, a current may flow from the anode adjacent to the first support plate 101b to the cathode adjacent to the second support plate 101c, that is, along an upward direction.

The body 101a may have a cylindrical shape. Each of the first and second support plates 101b, 101c may have a circular shape when viewed from above. A lower surface of the first support plate 101b may have a planar shape. An upper surface of the second support plate 101c may have a planar shape.

The first and second support plates 101b, 101c may have different sizes. For example, a diameter of the first support plate 101b may be larger than that of the second support plate 101c. Furthermore, a diameter of the first support plate 101b may be formed larger than that of the body 101a, and a diameter of the body 101a may be formed larger than that of the second support plate 101c.

The first and second support plates 101b, 101c may be made of an insulating material.

For another example, the first and second support plates 101b, 101c may be made of a metal material. In this case, the anode of the semiconductor device may be electrically connected to the first support plate 101b, and the cathode of the semiconductor device may be electrically connected to the second support plate 101c.

The first switching module 100 may include a plurality of cooling plates 104 stacked along a vertical direction with respect to the support module 400. The switch 101 may be disposed between the cooling plates 104. The switch 101 and the cooling plate 104 may be alternately stacked. For instance, the cooling plate 104 is provided, the switch 101 is disposed on the cooling plate 104, and the cooling plate 104 is disposed on the switch 101. The cooling plate 104 may be provided on the uppermost switch among the plurality of switches 101 and the cooling plate 104 may be provided below the undermost switch among the plurality of switches 101. In other words, when n switches 101 are provided therein, (n+1) cooling plates may be provided therein. In this case, the first switch is located on the first cooling plate, and the nth switch is located under the (n+1)th cooling plate.

The cooling plate 104 may have a rectangular shape, for instance, when viewed from above, but the present disclosure is not limited thereto. The size of the cooling plate 104 may be larger than that of the switch 101 at least. The switch 101 may be located at the center of the cooling plate 104.

The cooling plate 104 and the switch 101 may be in surface contact. For instance, an upper surface of the first cooling plate may be in surface contact with a lower surface of the first switch. A lower surface of the second cooling plate is in surface contact with an upper surface of the first switch, and an upper surface of the second cooling plate is in surface contact with a lower surface of the second switch. A lower surface of the third cooling plate may be in surface contact with an upper surface of the second switch.

As described above, the lower surface and the upper surface of the switch 101 are brought into surface contact with the cooling plate 104 disposed below and above the switch 101 to cool the switch 101 by the cooling plate 104, thereby easily releasing heat generated from the switch 101. The remaining switches other than the first switch, the second switch, and the third switch of the plurality of switches 101 and the remaining cooling plates other than the first cooling plate, the second cooling plates, and the third cooling plate of the plurality of cooling plates 104 may also have the foregoing arrangement structure.

As illustrated in FIG. 6, one side surface of the switch 101, for instance, one side surface of the first support plate 101b, may be in contact with an upper surface of the cooling plate 104. The other surface of the switch 101, for instance, one side surface of the second support plate 101c, may be in contact with a lower surface of another cooling plate 104 disposed on the cooling plate 104. For convenience, the cooling plate 104 may be referred to as a first cooling plate, and another cooling plate 104 may be referred to as a second cooling plate.

A mounting portion 430 for mounting the switch 101 is provided at the center of the cooling plate 104. The mounting portion 430 may be formed thicker than the other portion of the cooling plate 104.

The cooling plate 104 may include an engagement portion 434 (434a, 434b) disposed on one side of the upper surface to be guided by the switch 101 and located at a normal position. The engagement portion 434 (434a, 434b) may be provided on the mounting portion 430.

The engagement portion may include at least one or more engagement protrusions 434a, 434b having a circular shape, for instance. The engagement protrusion 434a, 434b may be disposed apart by a radius of the switch 101 from the center of the cooling plate 104. More specifically, the engagement protrusion 434a, 434b may be disposed to be spaced apart by a radius of the first support plate 101b of the switch 101 from the center of the cooling plate 104.

A first engagement protrusion 434a may be disposed at one corner of an upper surface of the first cooling plate 104, and a second engagement protrusion 434b may be disposed at the other edge of the upper surface of the first cooling plate 104.

The first and second stopping protrusions 434a, 434b may be arranged in parallel to one side surface of the first cooling plate 104. Specifically, the first and second engagement protrusions 434a, 434b disposed on the first cooling plate 104 may be arranged in parallel to one side surface of the first cooling plate 104. In other words, each of the first and second engagement protrusions 434a, 434b may be disposed at the same distance from one side surface of the first cooling plate 104.

Each of the first and second engagement protrusions 434a, 434b has a circular shape when viewed from above, and may have a thickness greater than that of the first support plate 101b of the switch 101. Accordingly, the switch 101 is slid along an upper surface of the first cooling plate 104 in a direction in which the first and second engagement protrusions 434a, 434b are located, and then stopped by the first and second engagement protrusions 434a, 434b. In addition, since the first and second engagement protrusions 434a, 434b have a large thickness, the switch 101 is stopped at the first and second engagement protrusions 434a, 434b, and then not released beyond the first and second engagement protrusions 434a, 434b.

The first and second engagement protrusions 434a, 434b may be formed separately from the first cooling plate 104, and fastened to the first cooling plate 104. For instance, first and second recesses may be formed on one side of an upper surface of the first cooling plate 104, and a screw thread may be formed on the inside thereof. In this case, an outer surface of each of the first and second engagement protrusions 434a, 434b is also formed with a screw thread, and each of the first and second engagement protrusions 434a, 434b may be fastened to the first and second recesses by screw coupling.

For another example, the first and second engagement protrusions 434a, 434b may be made of the same material as the first cooling plate 104. In other words, when the first cooling plate 104 is molded, the first and second engagement protrusions 434a, 434b may be formed together.

On the other hand, the first cooling plate 104 may further include a protruding portion 437 protruded from the side surface along an outward direction to stack a plurality of cooling plates at normal positions.

The protruding portion 437 may include at least one or more protruding portions. For instance, the first protruding portion 437 is disposed on a first side of the first cooling plate 104, and a second protruding portion (not shown) is disposed on a second side opposite to the first side of the first cooling plate 104.

The protruding portion 437 may be formed separately from the cooling plate 104 and fastened to the cooling plate 104 or molded together with the cooling plate 104 by molding process.

The protruding portion 437 may include a guide hole 439 for inserting the guide rods 450, 452 to maintain the plurality of cooling plates 104 at normal positions. For instance, the guide hole 439 may penetrate along a vertical direction of the protrusion portion 437. In other words, the guide hole 439 may pass from a lower surface of the protruding portion 437 to an upper portion and vice versa. An inner diameter of the guide hole 439 may be equal to or larger than that of the guide rods 450, 452.

As will be described later, first, at least one or more guide rods 450, 452 may be provided in the first switching module, and then the guide hole 439 of each cooling plate 104 may be inserted into an upper portion of the guide rod and guided to a lower portion thereof, thereby maintaining a normal position of each cooling plate 104. For instance, the first cooling plate 104 is inserted into at least one or more guide rods, and then the first switch 101 is slidably moved from one side of an upper surface of the first cooling plate 104 in a direction of at least one of the first and second engagement protrusions 434a, 434b, and the sliding movement of the first switch 101 may be stopped when the first switch 101 is brought into contact with at least one of the first and second engagement protrusions 434a, 434b. When the first switch is stopped, the center of the first switch 101 may coincide with the center of the first cooling plate 104.

The remaining cooling plates 104 other than the first cooling plate 104 may also include at least one of the first and second engagement protrusions 434a, 434b and at least one protruding portion 437 provided on the first cooling plate 104.

The first switching module 100 may include first and second electrode plates 107, 110 that are electrically connected to a plurality of vertically disposed switches 101.

For instance, the first electrode plate 107 may be disposed on a switch located at the top among the plurality of vertically disposed switches 101. For instance, the second electrode plate 110 may be disposed on a switch located at the bottom among the plurality of vertically disposed switches 101.

As described above, the cooling plate 104 may be disposed above and below the switch 101 for cooling the switch 101. Therefore, since the cooling plate 104 is located between the first electrode plate 107 and the switch 101, the first electrode plate 107 may be electrically connected to the switch 101 through a connecting member (not shown), but the present disclosure is not limited thereto. Similarly, since the cooling plate 104 is located between the second electrode plate 110 and the switch 101, the second electrode plate 110 may be electrically connected to the switch 101 through a connecting member (not shown).

The first and second electrode plates may be copper plates made of copper (Cu), but the present disclosure is not limited thereto.

The first electrode plate 107 may be in surface contact with the cooling plate 104 disposed at the top and the second electrode plate 110 may be in surface contact with the cooling plate 104 disposed at the bottom.

The first switching module 100 may include first and second terminals 113, 116 connected to the first and second electrode plates 110, respectively.

The first and second terminals 113, 116 may be made of a metal having excellent electrical conductivity. For instance, the first and second terminals 113, 116 may include copper (Cu) or aluminum (Al).

The first terminal 113 may be electrically connected to the first electrode plate 107. The first terminal 113 may be bent at least once from the first electrode plate 107 and protruded along a lateral direction. For instance, the first terminal 113 may include a first region protruded from the first electrode plate 107 in a lateral direction, a second region extended subsequent to being bent in an upward direction from an end of the first region, and a third region extended from an end of the second region along a lateral direction. The second terminal 116 may be electrically connected to the second electrode plate 110. The second terminal 116 may be bent at least once from the second electrode plate 110 and protruded along a lateral direction. For instance, the first terminal 113 and the second terminal 116 may be protruded in the same direction, but the present disclosure is not limited thereto.

The first and second terminals 113, 116 may be protruded along lateral directions opposite to each other. For instance, the first terminal 113 may be protruded along a first lateral direction, for instance, and the second terminal 116 may be protruded along a second lateral direction, for instance, opposite to the first lateral direction.

The first switching module 100 may include first and second supporting members 125, 128 provided to support a plurality of switches 101 and a plurality of cooling plates 104.

The first and second supporting members 125, 128 may have a plate shape. The first and second supporting members 125, 128 may have a rectangular shape when viewed from above.

The first and second supporting members 125, 128 may be made of a material having excellent insulating properties and supporting strength. For instance, the first and second supporting members 125, 128 may be made of stainless steel.

For instance, the first supporting member 125 may be disposed above the top cooling plate among the plurality of cooling plates 104. For instance, the second supporting member 128 may be disposed under the bottom cooling plate among the plurality of cooling plates 104.

A size of each of the first and second supporting members 125, 128 may be larger than that of the cooling plate 104. The size of each of the first and second supporting members 125, 128 is large, and thus the support rods 135, 136, 137, 138, which will be described later, may be spaced apart from the cooling plate 104 and disposed on a side surface of the switch 101 and the cooling plate 104. In other words, the fastening of the support rods 135, 136, 137, 138 may be facilitated because the support rods 135, 136, 137, 138 are not disturbed by the cooling plate 104.

The first switching module 100 may include a plurality of support rods 135, 136, 137, 138 disposed between the first supporting member 125 and the second supporting member 128. Although four support rods 135, 136, 137, 138 are illustrated in the drawing, four or fewer or four or more support rods may be provided.

The support rods 135, 136, 137, 138 have a circular shape when viewed from above, but the present disclosure is not limited thereto. The support rods 135, 136, 137, 138 are disposed between the first supporting member 125 and the second supporting member 128 so that one side is fastened to the first supporting member 125 and the other side is connected to the second supporting member 128. The first and second supporting members may be supported by the support rods 135, 136, 137.

The support rods 135, 136, 137, 138 may be made of a material having excellent insulating properties and supporting strength. For instance, the support rods 135, 136, 137, 138 may be made of stainless steel.

The first switching module 100 may include first and second pressing members 131, 134 for pressing a plurality of switches 101 and a plurality of cooling plates 104 in a vertical direction.

The first and second pressing members 131, 134 may have elasticity. For instance, a first pressing member 131 may be pressed in a downward direction by the first supporting member 125. A plurality of switches 101 and a plurality of cooling plates 104 disposed below the first pressing member 131 may also be pressed in a downward direction as the first pressing member 131 is pressed in a downward direction. For instance, a second pressing member 134 may be pressed in an upward direction by the second supporting member 128. A plurality of switches 101 and a plurality of cooling plates 104 disposed above the second pressing member 134 may also be pressed along an upward direction as the second pressing member 134 is pressed in an upward direction.

The first switching module 100 may include a plurality of thyristors and a signal generation unit 140 disposed on a side surface of the plurality of cooling plates 104.

The signal generation unit 140 may include a substrate 141 and a plurality of drive units 143 mounted on the substrate 141. The signal generation unit 140 may further include a signal line 145 electrically connecting the drive unit 143 and each switch 101. The drive unit 143 may generate a gate signal for switching each switch 101 to provide it to the each switch 101 through each signal line 145. Each switch 101 may be switched by the gate signal.

One side of the substrate 141 may be fastened to the first supporting member 125 and the other side thereof may be fastened to the second supporting member 128.

<Second Switching Module 200>

A switch assembly of a reactive power compensation apparatus according to an embodiment may include the second switching module 200. The second switching module 200 may be a reverse switching module in which a current flows from the first electrode plate 107 to the second electrode plate 110 in a downward direction, for instance, but the present disclosure is not limited thereto.

The second switching module 200 may be disposed on the same plane as the first switching module 100. In other words, the second switching module 200 may be mounted on an upper surface of the support module 400. For instance, the first switching module 100 may be disposed on a first region of the support module 400, and the second switching module 200 may be disposed on a second region of the support module 400.

The second switching module 200 may include a plurality of switches 201, a plurality of cooling plates 204, first and second electrode plates 207, 210, first and second terminals 213, 216, first and second supporting members 225, 228, a plurality of support rods 235, 236, 237, 238, first and second pressing members 231, 234 and a signal generation unit 240.

Figure 7:
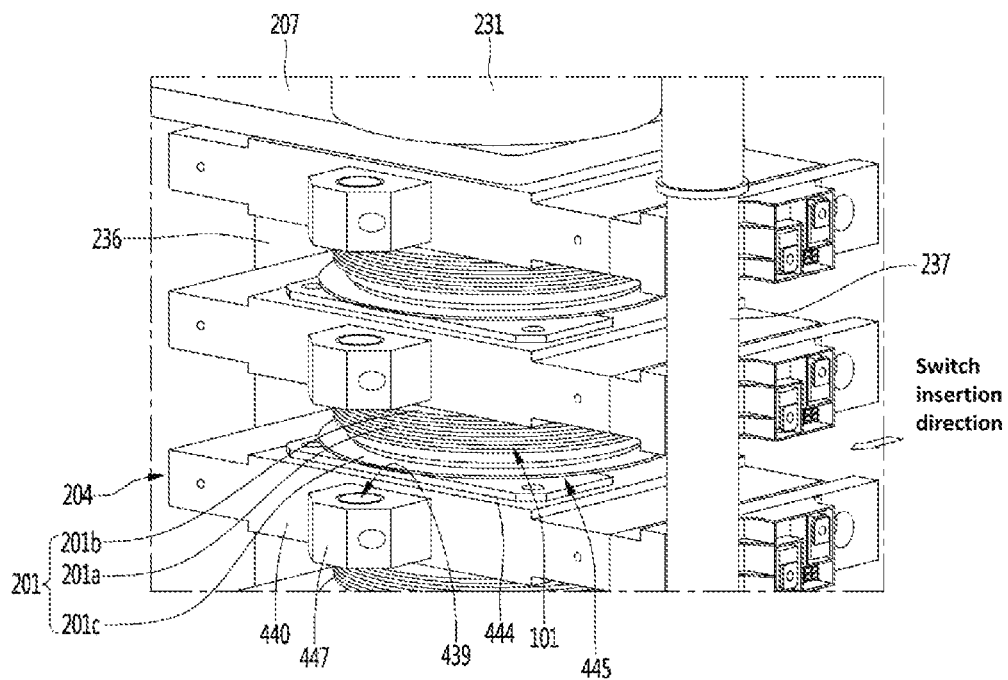
FIG. 7 is an enlarged view illustrating a second switching module according to an embodiment.

The switch 201 may include a body 201a, a first support plate 201b disposed on one side of the body 201a, and a second support plate 201c disposed on the other side of the body 201a, as illustrated in FIG. 7.

A semiconductor device may be embedded in the body 201a. For instance, an anode of the semiconductor device may be disposed adjacent to the first support plate 201b, and a cathode of the semiconductor device may be disposed adjacent to the second support plate 201c. When the semiconductor device is conducted, a current may flow from the anode adjacent to the first support plate 201b to the cathode adjacent to the second support plate 201c, that is, along a downward direction.

The body 201a may have a cylindrical shape. Each of the first and second support plates 201b, 201c may have a circular shape when viewed from above. A lower surface of the first support plate 201b may have a planar shape. An upper surface of the second support plate 201c may have a planar shape.

The first and second support plates 201b, 201c may be made of an insulating material.

For another example, the first and second support plates 201b, 201c may be made of a metal material. In this case, the anode of the semiconductor device may be electrically connected to the first support plate 201b, and the cathode of the semiconductor device may be electrically connected to the second support plate 201c.

As described above, the first switching module may be a forward switching module. In this case, in the first switching module, the first support plate 101b disposed under the body 101a may be in surface contact with an upper surface of the first cooling plate 104, for instance, and the second support plate 101c may be in surface contact with a lower surface of the second cooling plate 104, for instance, disposed on the first cooling plate 104.

On the contrary, the second switching module may be a reverse switching module. In this case, in the second switching module, the second support plate 201c may be disposed below the body 201a, and the first support plate 201b may be disposed above the body 201a. Accordingly, the second support plate 201c may be in surface contact with an upper surface of the first cooling plate 104, and the first support plate 201b may be in surface contact with a lower surface of the second cooling plate 104.

As illustrated in FIG. 7, the cooling plate 204 may include an engagement portion 444 disposed on one side of the upper surface to be guided by the switch 201 and located at a normal position.

The engagement portion 444 may include an engagement protrusion, an inner side 445 of which has a round shape. The engagement portion 444 may be disposed to be spaced apart by a radius of the switch 201 from the center of the cooling plate 204. Specifically, the engaging portion 444 may be disposed to be spaced apart by a radius of the second support plate 201c of the switch 201a from the center of the cooling plate 204.

The inner surface 445 of the engagement portion 444 may have a shape corresponding to an outside of the switch 201. Specifically, an inner side 445 of the engagement protrusion 444 may have a shape corresponding to an outside of the second support plate 201c of the switch 201.

The inner surface 445 of the engagement portion 444 may be in surface contact with an outer surface of the second support plate 201c of the switch 201.

The engagement protrusion 444 may have a thickness greater than that of the second support plate 201c of the switch 201. Accordingly, the switch 201 may be stopped by the engagement protrusion 444 while the switch 201 is slid in a direction in which the engagement protrusion 444 is located along an upper surface of the first cooling plate 204. In addition, since the engagement protrusion 444 has a large thickness, the switch 201 is stopped at the engagement protrusion 444, and then not released beyond the engagement protrusion 444.

The engagement portion 444 may be formed separately from the first cooling plate 204, and fastened to the first cooling plate 204. For instance, first and second recesses may be formed on one side of an upper surface of the first cooling plate 204, and a screw thread may be formed on the inside 445 thereof. In this case, an outer surface of the engagement portion 444 may also be formed with a screw thread, and thus the engagement portion 444 may be fastened to the first and second recesses by screw coupling.

For another example, the engagement portion 444 may be made of the same material as the first cooling plate 204. In other words, when the first cooling plate 204 is molded, the engagement protrusion 444 may be formed together.

On the other hand, the first cooling plate 204 may further include a protruding portion 447 protruded from the side surface along an outward direction to stack a plurality of cooling plates 204 at normal positions.

The protruding portion 447 may include at least one or more protruding portions. For instance, the first protruding portion 447 is disposed on a first side of the first cooling plate 204, and a second protruding portion (not shown) is disposed on a second side opposite to the first side of the first cooling plate 204.

The protruding portion 447 may be formed separately from the cooling plate 204 and fastened to the cooling plate 204 or molded together with the cooling plate 204 by molding process.

The protruding portion 447 may include a guide hole 439 for inserting the guide rods (not shown) to maintain the plurality of cooling plates 204 at normal positions. For instance, the guide hole 439 may penetrate along a vertical direction of the protrusion portion 447. In other words, the guide hole 439 may pass from a lower surface of the protruding portion 447 to an upper portion and vice versa. An inner diameter of the guide hole 439 may be equal to or larger than that of the guide rods.

As will be described later, first, at least one or more guide rods 450, 452 (see FIG. 8) may be provided in the first switching module 100, and then the guide hole 439 of each cooling plate 204 may be inserted into an upper portion of the guide rod 450, 452 (see FIG. 8) and guided to a lower portion thereof, thereby maintaining a normal position of each cooling plate 204. For instance, when the first cooling plate 204 is inserted into at least one or more guide rods 450, 452 (see FIG. 8), and then the first switch 101 is slidably moved from one side of an upper surface of the first cooling plate 204 in a direction of the engagement protrusion 444, and brought into contact with the engagement protrusion 444, the sliding movement of the first switch 101 may be stopped. When the first switch 101 is stopped, the center of the first switch 101 may coincide with the center of the first cooling plate 204.

The remaining cooling plates other than the first cooling plate 204 may also include an engagement protrusion 444 and at least one or more protruding portions 447 provided on the first cooling plate 204.

The switch 201 of the second switching module 200 may have the same structure as that of the switch 201 of the first switching module 100. The cooling plate 204 of the second switching module 200 may have the same structure as the cooling plate 104 of the first switching module 100. The first and second electrode plates 207, 210 of the second switching module 200 may have the same structure as the first and second electrode plates 107, 110 of the first switching module 100. The first and second electrode plates 213, 216 of the second switching module 200 may have the same structure as the first and second terminals 113, 116 of the first switching module 100. The first and second supporting members 225, 228 of the second switching module 200 may have the same structure as the first and second supporting members 125, 128 of the first switching module 100. The support rod of the second switching module 200 may have the same structure as that of the first switching module 100. The first and second electrode plates 231, 234 of the second switching module 200 may have the same structure as the first and second pressing members 131, 134 of the first switching module 100. The signal generation unit 240 of the second switching module 200 may have the same structure as the signal generation unit 140 of the first switching module 100. Accordingly, each component of the second switching module 200 may be easily understood from the respective components of the first switching module 100 described in detail above, and thus each component of the second switching module 200 will be briefly described.

A plurality of cooling plates 204 are provided, and a switch 201 may be disposed between the cooling plates 204. In other words, the second switching module 200 may have a second stack structure in which a plurality of cooling plates 204 and a plurality of switches 201 are stacked along a vertical direction with respect to the support module 400.

The cooling plate 204 and the switch 201 may be in surface contact. As described above, the lower surface and the upper surface of the switch 201 are brought into surface contact with the cooling plate 204 disposed below and above the switch 201 to cool the switch 201 by the cooling plate 204, thereby easily releasing heat generated from the switch 201.

The first electrode plate 207 may be disposed above a switch located at the top of a plurality of vertically disposed switches 201. For instance, the second electrode plate 210 may be disposed below a switch located at the bottom of the plurality of vertically disposed switches 201.

The cooling plate 204 may be located between the first electrode plate 207 and the switch 201.

The first terminal 213 may be electrically connected to the first electrode plate 207, and bent at least once from the first electrode plate 207 and protruded along a lateral direction. The second terminal 216 may be electrically connected to the second electrode plate 210, and bent at least once from the second electrode plate 210 and protruded along a lateral direction. The first and second terminals 213, 216 may be protruded along lateral directions opposite to each other.

The first supporting member 225 is disposed above the top of the plurality of cooling plates 204, and the second supporting member 228 is disposed below the bottom of the plurality of cooling plates 204. Accordingly, a plurality of switches 201 and a plurality of cooling plates 201 disposed between the first supporting member 225 and the second supporting member 228 may be supported by the first supporting member 225 and the second supporting member 228.

A plurality of support rods may be fastened to the first supporting member 225 and the second supporting member 228 to support the first and second supporting members.

The plurality of switches 201 and the plurality of cooling plates 204 disposed between the first and second pressing members 231, 234 may be pressed by the first and second pressing members 231, 234.

The signal generation unit 240 may include a substrate 241 and a plurality of drive units 243 mounted on the substrate 241. The signal generation unit 240 may further include a signal line 245 electrically connecting the drive unit 243 and each switch 201. The signal generation unit 240, as a member for generating a gate signal for switching each switch 201, may be disposed on a side surface of the plurality of switches 201 and the plurality of cooling plates 204 and fastened to the first supporting member 225 and the second supporting member 228.

<Connection Cooling Plate 105>

A switch assembly of a reactive power compensation apparatus according to an embodiment may include a connection cooling plate 105 for connecting a cooling unit of the first switching module 100 and a cooling unit of the second switching module 200.

The connection cooling plate 105 may be made of the same material as that of the cooling unit of the first switching module 100 and the cooling unit of the second switching module 200, but the present disclosure is not limited thereto.

The connection cooling plate 105 is detachable from the cooling unit of the first switching module 100 and the cooling unit of the second switching module 200. In other words, the connection cooling plate 105 may be fastened or unfastened to the cooling unit of the first switching module 100 and the cooling unit of the second switching module 200.

<Connection Electrodes 117, 118>

The switch assembly of the reactive power compensation apparatus according to an embodiment may include first and second connecting electrodes 117, 118.

The first connecting electrode 117 may fasten a first terminal 113 of the first switching module 100 and a first terminal 213 of the second switching module 200. Accordingly, the first terminal 113 of the first switching module 100 and the first terminal 213 of the second switching module 200 may be electrically connected to the first connecting electrode 117.

The second connecting electrode 118 may fasten a second terminal 116 of the first switching module 100 and a second terminal 216 of the second switching module 200. Accordingly, the second terminal 116 of the first switching module 100 and the second terminal 216 of the second switching module 200 may be electrically connected to the second connecting electrode 118.

<First and Second Bus Bars 119, 122>

The switch assembly of the reactive power compensation apparatus according to an embodiment may include first and second connecting electrodes 119, 122.

The first bus bar 119 may be fastened to the first connecting electrode 117. At least one or more first bus bars may be fastened to the first connecting electrode 117. The first bus bar 119 may be bent at least once from the first connecting electrode 117 and protruded in a lateral direction. The second bus bar 122 may be fastened to the second connecting electrode 118. At least one or more second bus bars may be fastened to the second connecting electrode 118. The second bus bar 122 may be bent at least once from the second connecting plate 118 and protruded along a lateral direction.

The first and second bus bars 119, 122 may be protruded along lateral directions opposite to each other.

In the embodiment, the first electrode plates 107, 207, the second electrode plates 110, 210, the first terminals 113, 213, the second terminals 116, 216, the first connecting electrode 117, the second connecting electrode 118, the first bus bar 119, and the second bus bar 122 may be made of a metal material having excellent electrical conductivity. The first electrode plates 107, 207, the second electrode plates 110, 210, the first terminal 117, the second terminal 118, the first bus bar 119, and the second bus bar 122 may be made of the same metal material, but the present disclosure is not limited thereto.

<Snubber Circuits 300, 310, 320, 330>

The switch assembly of the reactive power compensation apparatus according to an embodiment may include snubber circuits 300, 310, 320, 330.

The snubber circuit may include a first resistor module 300, a second resistor module 310, a first capacitor module 320, and a second capacitor module 330.

The first resistor module 300 may include a first resistor substrate 301 and a plurality of first resistor devices 303 mounted on the first resistor substrate 301. For instance, the plurality of first resistor devices 303 may be connected in series. The second resistor module 310 may include a second resistor substrate 311 and a plurality of second resistor devices 313 mounted on the second resistor substrate 311. For instance, the plurality of second resistor devices 313 may be connected in series.

The first capacitor module 320 may include a first capacitor substrate 321 and a plurality of first capacitor devices 323 mounted on the first capacitor substrate 321. For instance, the plurality of first capacitor devices 323 may be connected in parallel. The second capacitor module 330 may include a second capacitor substrate 331 and a plurality of second capacitor devices 333 mounted on the second capacitor substrate 331. For instance, the plurality of second capacitor devices 333 may be connected in parallel.

In terms of electric circuit, the first resistor device 303 and the second resistor device 313 are connected in series, and the first and second capacitor devices 303, 313 are connected between the first resistor device 303 and the second resistor device 313. The first and second capacitor devices 321, 333 may are connected in parallel.

In terms of arrangement structure, the first resistor substrate 301 of the first resistor module 300 may be fastened to the first supporting member 125 at one side and fastened to the second supporting member 128 at the other side. The second resistor substrate 311 of the second resistor module 310 may be fastened to the first supporting member 225 at one side and fastened to the second supporting member 228 at the other side. The first capacitor substrate 321 of the first capacitor module 320 may be fastened to the first supporting member 125 at one side and fastened to the second supporting member 128 at the other side. The second capacitor substrate 331 of the second capacitor module 330 may be fastened to the first supporting member 225 at one side and fastened to the second supporting member 228 at the other side. Moreover, the first resistor module 300 may be disposed on one side of the first switching module 100, and the second resistor module 310 may be disposed on one side of the second switching module 200. The first and second capacitor modules 320 may be disposed on the other side of the first switching module 100, and the second capacitor module 330 may be disposed on the other side of the second switching module 200.

In terms of cooling, first branch pipes 381, 383 branched from the first main pipe 380 are connected to the cooling plate 104 of the first switching module 100 and the cooling plate 204 of the second switching module 200. The first connection pipe 411 may be connected between the cooling plate 104 of the first switching module 100 and the resistor device 303 of the first resistor module 300. The second connection pipe 413 may be connected between the cooling plate 204 of the second switching module 200 and the resistor device 313 of the second resistor module 310. The second branch pipes 391, 393 may be connected from the second main pipe 390 to the resistor device 303 of the first resistor module 300 and the resistor device 313 of the second resistor module 310. Accordingly, cooling water is supplied to the cooling plate 104 of the first switching module 100 and the cooling plate 204 of the second switching module 200 through the first main pipe 380 and the first branch pipes 381, 383 to cool the switch 101 of the first switching module 100 and the switch 201 of the second switching module 200, and then discharged through the first and second connection pipes 411, 413, the second branch pipes 391, 393 and the second main pipe 390.

<First and Second Support Plates 360, 370>

The switch assembly of the reactive power compensation apparatus according to an embodiment may include first and second support plates 360, 370 disposed above and below the first and second switching modules 100, 200.

The first and second switching modules 100, 200 may be disposed between the first support plate 360 and the second support plate 370. The first and second switching modules 100, 200 may be supported by the first support plate 360 and the second support plate 370. For instance, an upper side of the first and second switching modules 100, 200 is fastened to the first support plate 360 and a lower side of the first and second switching modules 100, 200 is fastened to the second support plate 370. The second support plate 370 may be fastened to an upper side of the support module 400.

<First and Second Corona Shields 340, 350>

The switch assembly of the reactive power compensation apparatus according to an embodiment may include first and second corona shields 340, 350.

The first and second corona shields 340, 350 may have a ring shape larger than a size of each of the first and second support plates 360, 370. Each of the first and second corona shields 340, 350 may be disposed to surround the first and second support plates 360, 370, and fastened to at least one or more regions of the first and second support plates 360, 370. Since the first and second corona shields 340, 350 are larger than the size of each of the first and second support plates 360, 370, the first and second corona shields 340, 350 may be disposed to be spaced apart in an outward direction from each of the first and second support plates 360, 370. Accordingly, as intermediate connecting members, a plurality of fastening connecting portion may be provided to fasten the first and second corona shields 340, 350 to the first and second support plates 360, 370.

<First and Second Main Pipes 380, 390, First and Second Branch Pipes 381, 383, 391, 393, and First and Second Connecting Pipes 411, 413>

The reactive power compensating apparatus according to an embodiment may include first and second main pipes 380, 390, first and second branch pipes 381, 383, 391, 393, and first and second connecting pipes 411, 413.

The first main pipe 380 may be disposed on one side surface of one of the first and second switching modules 100, 200. The second main pipe 390 may be disposed on the other side surface of one of the first and second switching modules 100, 200.

The first branch pipes 381, 383 may be branched from the first main pipe 380 in both directions and connected to the cooling plates 104, 204 of the first and second switching modules 100, 200, respectively. The second branch pipes 391, 393 may be branched from the second main pipe 390 in both directions and connected to the resistor devices 303, 313 of the first and second resistor modules 300, 310, respectively.

The first connection pipe 411 may be connected between the cooling plate 104 of the first switching module 100 and the resistor device 303 of the first resistor module 300. The second connection pipe 413 may be connected between the cooling plate 204 of the second switching module 200 and the resistor device 313 of the second resistor module 310.

Accordingly, cooling water is supplied to the cooling plate 104 of the first switching module 100 and the cooling plate 204 of the second switching module 200 through the first main pipe 380 and the first branch pipes 381, 383 to cool the switch 101 of the first switching module 100 and the switch 201 of the second switching module 200, and then discharged through the first and second connection pipes 411, 413, the second branch pipes 391, 393 and the second main pipe 390.

For instance, the first and second main pipes 380, 390, the first and second branch pipes 381, 383, 391, 393 and the first and second connection pipes 411, 413 may be made of different materials. For instance, the first and second main pipes 380, 390, the first and second branch pipes 381, 383, 391, 393 may be made of a resin material, and the first and second connection pipes 411, 413 may be made of a copper (Cu) material.

The first and second connection pipes 411, 413 are disposed adjacent to the switches 101, 201 of the first and second switching modules 100, 200. A considerable amount of heat is generated in the switches 101, 201 of the first and second switching modules 100, 200, and thus the first and second connection pipes 411, 413 must be formed of a material having excellent heat resistance. Therefore, the first and second connection pipes 411, 413 are made of copper, and thus not affected by heat generated by the switches 101, 201 of the first and second switching modules 100, 200.

The first and second main pipes 380, 390 and the first and second branch pipes 381, 383, 391, 393 are disposed on an outer surfaces of the first and second switching modules 100, 200, and thus hardly affected by heat generated by the switching of the first and second switching modules 100, 200. Therefore, a resin material which is cheaper than copper may be used for the first and second main pipes 380, 390 and the first and second branch pipes 381, 383, 391, 393.

In the above description, the first switching module 100 may be referred to as a second switching module, and the second switching module 200 may be referred to as a first switching module. The first electrode plate 107, 207 may be referred to as a second electrode plate and the second electrode plate 110, 210 may be referred to as a first electrode plate. The first terminal 113, 213 may be referred to as a second terminal, and referred to as a second terminal 116, 216. The first connecting electrode 117 may be referred to as a second connecting electrode, and the second connecting electrode 118 may be referred to as a first connecting electrode. The first bus bar 119 may be referred to as a second booth bar, and the second bus bar 122 may be referred to as a first booth bar. The first supporting member 125, 225, 360 may be referred to as a second supporting member, and the second supporting member 128, 228, 370 may be referred to as a first supporting member. The first pressing member 131, 231 may be referred to as a second pressing member, and the second pressing member 134, 234 may be referred to as a first pressing member. The first resistor module 300 may be referred to as a second resistor module, and the second resistor module 313 may be referred to as a first resistor module. The first main pipe 380 may be referred to as a second main pipe, and the second main pipe 390 may be referred to as a first main pipe. The first connection pipe 411 may be referred to as a second connection pipe, and the second connection pipe 413 may be referred to as a first connection pipe.

Figure 8:
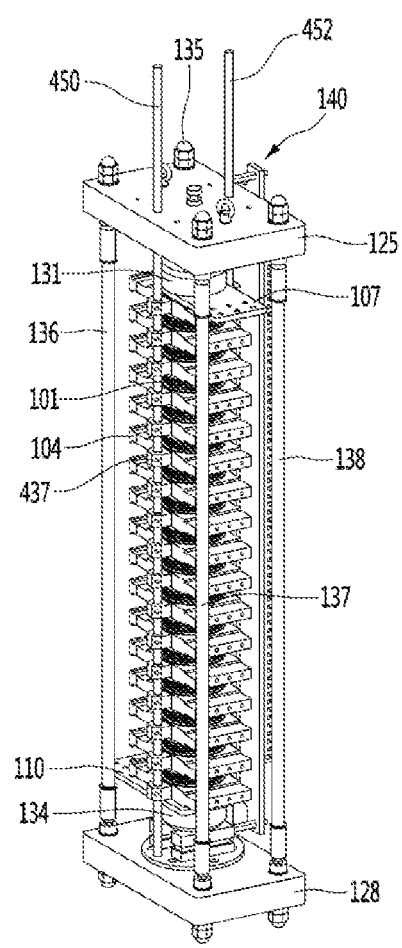
FIGS. 8 through 10 illustrate a method of assembling a first switching module according to an embodiment.
Figure 9:
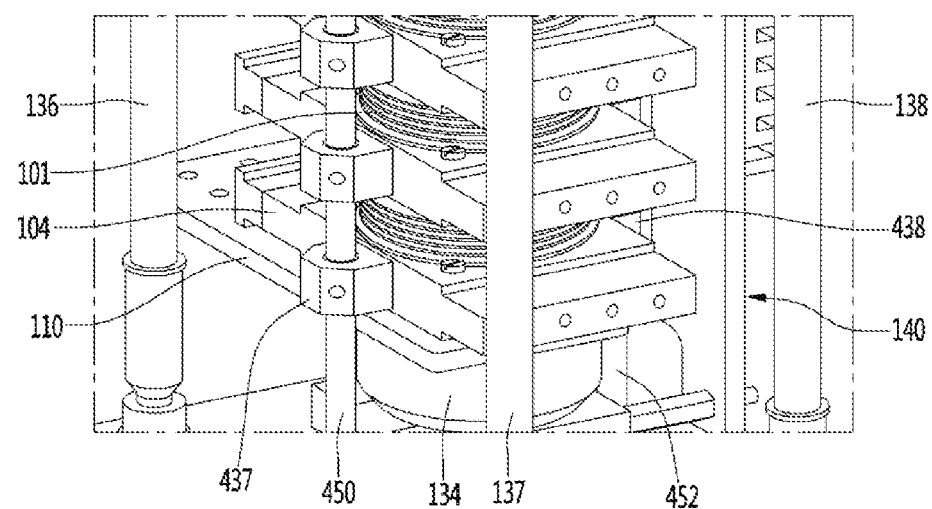
Figure 10:
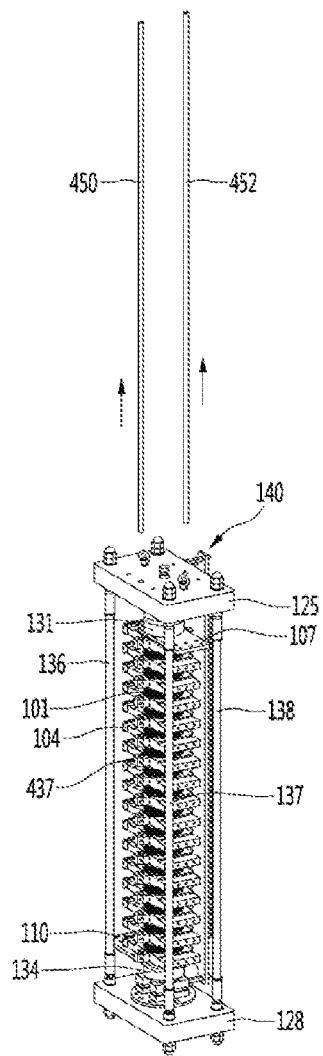

FIGS. 8 through 10 illustrate a method of assembling a first switching module according to an embodiment. An assembly method of the second switching module is also the same as that of the first switching module, and thus may be easily understood from FIGS. 8 through 10.

As illustrated in FIG. 8, the second supporting member 128 may be provided. The second pressing member 134 may be disposed on the second supporting member 128. The second electrode plate 110 may be disposed on the second supporting member 128.

At least one or more second guide rods 450, 452 may be fastened onto the second supporting member 128.

As illustrated in FIG. 9, a guide hole 439 of at least one of protruding portions 437, 438 of the first cooling plate 104, for instance, may be formed to correspond to at least one or more guide rods 450, 45, and then at least one or more guide rods 450, 452 may be inserted into the guide hole 439 of at least one of the protruding portions 437, 438 of the cooling plate 104. The first cooling plate 104 may be guided by the at least one or more guide rods 450, 452 and moved in a downward direction and disposed on the second electrode plate 110.

The first switch 101 may be slidably moved from one side to the other side on an upper surface of the first cooling plate 104 and stopped by at least one or more the engagement protrusions 444 provided on the upper surface of the first cooling plate 104. The first switch 101 may be moved from the top of the first cooling plate 104 to the bottom of the first cooling plate 104 since the first switch 101 is heavy, and thus slidably moved on an upper surface of the first cooling plate 104. Furthermore, the sliding movement of the first switch 101 may be stopped by at least one or more engagement protrusions 444, and at this time, the center of the first switch 104 may coincide with the center of the first cooling, and thus the first cooling plate 104 and the first switch 101 may be aligned at normal positions.

The remaining cooling plates other than the first cooling plate 104 and the remaining switches other than the first switch 101 may also be assembled in this manner, and thus all the plurality of cooling plates 104 and the plurality of switches 201 may be aligned at normal positions. In other words, a plurality of cooling plates 104 are aligned using at least one or more guide rods 450, 452, and the plurality of cooling plates 104 and at least one or more switches 201 may be aligned using at least one or more engagement portions 444. Furthermore, the plurality of switches 201 may be aligned using at least one or more engagement portions 444.

In this manner, the cooling plates 104, 204 and the switches 101, 201 may be alternately stacked on the second electrode plate 110 using at least one or more guide rods 450, 452 and at least one engagement portions 444 provided on each cooling plate 104, 204.

When the stacking of the cooling plates 104, 204 and the switches 101, 201 is completed, the first electrode plate 107 may be disposed on the cooling plates 104, 204 disposed on the top.

The first pressing member 131 may be disposed on the first electrode plate 107, and the first supporting member 125 may be disposed on the first pressing member 131. At this time, an upper side of at least one or more guide rods 450, 452 may be protruded from the first supporting member 125 through at least one or more holes of the first supporting member 125. For this purpose, a length of at least one or more guide rods 450, 452 may be greater than a distance between the first supporting member 125 and the second supporting member 128.

A plurality of support rods 135, 136, 137, 138 may be fastened between the first supporting member 125 and the second supporting member 128 to support the cooling plates 104, 204 and the switches 101, 201 disposed between the first supporting member 125 and the second supporting member 128.

The second pressing member 134 may be pressed through the second supporting member 128 using a pressing device such as a cylinder to separate between the second pressing member 134 and the second supporting member 128, and then an additional supporting member may be inserted into the separated space, thereby fixing a plurality of cooling plates 104, 204 and a plurality of switches 101, 201 disposed between the first supporting member 125 and the second supporting member 128 at normal positions. The second pressing member 134 may be included in the second supporting member 128, but the present disclosure is not limited thereto.

In this manner, when the plurality of cooling plates 104, 204 and the plurality of switches 101, 201 are fixed at normal positions, at least one or more guide rods 450, 452 may be drawn out from a guide hole of each of the cooling plates 104, 204. In this case, a supporting member may be inserted between the second pressing member 134 and the second supporting member 128 to fix the plurality of cooling plates 104, 204 and the plurality of switches 101, 201 at normal positions, and thus even when at least one of the guide rods 450, 452 is removed, the plurality of cooling plates 104, 204 and the plurality of switches 101, 201 may be maintained all the time at normal positions.

The detailed description thereof should not be construed as restrictive in all aspects but considered as illustrative. The scope of the embodiment should be determined by reasonable interpretation of the appended claims and all changes that come within the equivalent scope of the embodiment are included in the scope of the embodiment.

What is the claimed is:

1. A switch assembly of a reactive power compensation apparatus, the switch assembly comprising:
   a support module;
   a first switching module having a first stack structure perpendicular to the supporting module; and
   a second switching module having a second stack structure perpendicular to the supporting module, the second switching module being connected in parallel with the first switching module,
   wherein each of the first and second switching modules comprises:
      a plurality of cooling plates stacked along a vertical direction with respect to the supporting module; and
      a plurality of switches disposed between the plurality of cooling plates, and
   wherein each of the plurality of cooling plates comprises:
      an engagement portion disposed on one side of an upper surface of each of the plurality of cooling plates to be located at a normal position by guiding the plurality of switches,
      wherein the engagement portion comprises at least one or more engagement protrusions having a circular shape, and
      wherein the at least one or more engagement protrusions are spaced apart by a radius of each of the plurality of switches from a center of each of the plurality of cooling plates.

2. The switch assembly of claim 1, wherein the each of the plurality of switches comprises:
   a body embedded with a semiconductor device;
   a first support plate disposed on one side surface of the body; and
   a second support plate disposed on the other side surface of the body.

3. The switch assembly of claim 2, wherein the first and second support plates have different sizes.

4. The switch assembly of claim 2, wherein the upper surface of each of the plurality of cooling plates in the first switching module or the second switching module is in contact with the first support plate or the second support plate.

5. The switch assembly of claim 4, wherein a thickness of the engagement portion is larger than a thickness of the first support plate or the second support plate.

6. The switch assembly of claim 2, wherein the engagement portion is formed in a round shape on an inner side surface thereof and brought into surface contact with the first support plate or the second support plate.

7. The switch assembly of claim 1, wherein each of the plurality of cooling plates further comprises a first protruding portion protruded from a first side surface of each of the plurality of cooling plates to stack the plurality of cooling plates at normal positions.

8. The switch assembly of claim 7, wherein the first protruding portion comprises a guide hole for being inserted into a guide rod provided to maintain the normal position.

9. The switch assembly of claim 8, wherein each of the plurality of cooling plates further comprises a second protruding portion protruded from a second side surface of each of the plurality of cooling plates, wherein the second side surface is opposite to the first side surface.

* * * * *